United States Patent
Li et al.

(10) Patent No.: US 9,670,321 B2
(45) Date of Patent: *Jun. 6, 2017

(54) CURABLE RESIN, BLUE PHOTORESIST, COLOR FILTER, AND METHODS OF PREPARING THE SAME, AND COLOR DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Hongyan Li, Beijing (CN); Jiuxia Yang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 230 days.

This patent is subject to a terminal disclaimer.

(21) Appl. No.: 14/387,807

(22) PCT Filed: Dec. 30, 2013

(86) PCT No.: PCT/CN2013/090899
§ 371 (c)(1),
(2) Date: Sep. 24, 2014

(87) PCT Pub. No.: WO2014/194660
PCT Pub. Date: Dec. 11, 2014

(65) Prior Publication Data
US 2016/0244564 A1    Aug. 25, 2016

(30) Foreign Application Priority Data
Jun. 6, 2013  (CN) .......................... 2013 1 0224624

(51) Int. Cl.
| G02B 5/20 | (2006.01) |
| G03F 7/038 | (2006.01) |
| C08G 73/10 | (2006.01) |
| G02B 1/04 | (2006.01) |
| B29D 11/00 | (2006.01) |
| C09D 179/08 | (2006.01) |
| G03F 7/00 | (2006.01) |
| G03F 7/004 | (2006.01) |
| G02B 5/00 | (2006.01) |
| G02B 5/22 | (2006.01) |
| G02F 1/1335 | (2006.01) |

(52) U.S. Cl.
CPC .... C08G 73/1067 (2013.01); B29D 11/00634 (2013.01); C08G 73/105 (2013.01); C08G 73/1014 (2013.01); C08G 73/1071 (2013.01); C09D 179/08 (2013.01); G02B 1/04 (2013.01); G02B 5/003 (2013.01); G02B 5/223 (2013.01); G03F 7/0007 (2013.01); G03F 7/0046 (2013.01); G03F 7/0387 (2013.01); G03F 7/0388 (2013.01); G02B 5/201 (2013.01); G02F 1/133514 (2013.01)

(58) Field of Classification Search
CPC   C08G 73/1014; C08G 73/101; C08G 73/105; C08G 73/1067; G03F 7/0007; G03F 7/0046; G03F 7/0387; C08L 33/24; C08L 79/08; C08L 33/10; C08L 25/06; C08D 179/08
USPC .................................................. 430/7, 287.1
See application file for complete search history.

(56) References Cited

U.S. PATENT DOCUMENTS

| 4,430,418 A | * | 2/1984 | Goff ...................... C08F 290/14 |
| | | | 430/281.1 |
| 5,034,503 A | | 7/1991 | Camberlin |
| 7,648,815 B2 | | 1/2010 | Itatani et al. |
| 2007/0259278 A1 | | 11/2007 | Kura et al. |

FOREIGN PATENT DOCUMENTS

| CN | 1547683 A | 11/2004 |
| CN | 1548474 A | 11/2004 |
| CN | 102492320 A | 6/2012 |
| CN | 103304810 A | 9/2013 |
| CN | 103304811 A | 9/2013 |
| CN | 103304812 A | 9/2013 |
| CN | 103304813 A | 9/2013 |
| CN | 103319713 A | 9/2013 |
| EP | 0140273 B1 | 9/1991 |
| KR | 101357333 B1 | 2/2014 |

OTHER PUBLICATIONS

First Chinese Office Action Appln. No. 201310224624.7; Dated Dec. 9, 2014.
He, Xuan, "Research on the Photoresist for the Color Filter", China Academic Journal Electronics Publishing House, Dec. 6, 2007, pp. 74-77.
Li, Hong-Yan Yang et al, (Color Filter for TFT-LCD, China Academic Journal Electronics Publishing House, May 19, 2005, pp. 41-44.
Sapozhnikov, D.A. et al., "Photopolymerization of (Meth) Acrylates in the Presence of Polyhereroarylenes", Polymer Science, Series B, vol. 51, Revised Mar. 27, 2008 pp. 1-12.
Wang, Yong, "Applications of Polyimide Film in Liquid Crystal Display", Advanced Display vol. 147, Feb. 27, 2013, pp. 22-24.
International Search Report Appln. No. PCT/CN2013/090899; Dated Mar. 21, 2014.

(Continued)

Primary Examiner — John A McPherson
(74) Attorney, Agent, or Firm — Ladas & Parry LLP

(57) ABSTRACT

A curable resin including 1 part by weight of dianhydride, 0.8 to 1.5 parts by weight of diamine, and 1.5 to 5 parts by weight of vinyl monomer is disclosed. A blue photoresist, a color filter, and methods of preparing the same, and a color display device are also disclosed.

13 Claims, 1 Drawing Sheet

(56) References Cited

OTHER PUBLICATIONS

First Chinese Office Action issued Dec. 9, 2014; Appln. No. 20130224624.7.
Second Chinese Office Action issued Jun. 15, 2015 Appln. No. 201310224624.7.
Chinese Notice of Allowance issued Nov. 5, 2015; Appln. No. 201310224624.7.
International Preliminary Report on Patentability Appln. No. PCT/CN2013/090899; Dated Dec. 8, 2015.

* cited by examiner

CURABLE RESIN, BLUE PHOTORESIST, COLOR FILTER, AND METHODS OF PREPARING THE SAME, AND COLOR DISPLAY DEVICE

TECHNICAL FIELD

Embodiments of the present invention relate to a curable resin, a blue photoresist, a color filter, and the methods of preparing the same, and a color display device.

BACKGROUND

Color filters are essential components for achieving the colorization of liquid crystal displays, and also relatively costly essential components. Color filters consist generally of glass substrate, Black Matrix, color layer, protective layer, and ITO (indium tin oxide) conductive film. Currently, the color layers are primarily prepared by the method of pigment dispersion, that is, dispersing homogeneously micronized pigment into a photosensitive resin to form a color photosensitive material which undergoes repeatedly procedures including coating, exposure, development, and the like, thereby forming the corresponding red, green, or blue color layer.

In the above described method, the blue photoresist for preparing a blue filter layer comprises, in general, various components, such as, pigments for colorization, unsaturated monomers, alkali soluble resins, high-boiling solvents, and the like. Thus, it is required that the color filters should be prepared at a relatively high curing temperature (up to 200° C. or above). On the one hand, it is used for the volatilization of solvents during the reaction, and on the other hand it is used for the good curing of resins, and the complete reaction of residual unsaturated bonds. However, such process not only increases the cost of products, but also produces relatively high energy consumption. Moreover, under such process conditions, the raw materials as used have to possess a high heat resistance to ensure the reliability of products.

SUMMARY OF INVENTION

To address the aforesaid problems, embodiments of the present invention provides a curable resin, a blue photoresist comprising the curable resin, a color filter comprising a blue filter layer formed from the blue photoresist, methods of preparing the same, and a color display device using the color filter.

An embodiment of the present invention provides a curable resin comprising:
dianhydride: 1 part by weight;
diamine: 0.8 to 1.5 parts by weight; and
vinyl monomer: 1.5 to 5 parts by weight,
wherein the dianhydride is selected from the group consisting of pyromellitic dianhydride, trimellitic anhydride, benzophenone tetracarboxylic dianhydride, biphenyltetracarboxylic dianhydride, 4,4'-oxydiphthalic anhydride or 4,4'-(hexafluoroisopropylidene)diphthalic anhydride;

The diamine is selected from the group consisting of 3-aminobenzyl amine, 2,2'-difluoro-4,4'-(9-fluorenylidene) diphenylamine, 2,2-bis(3-amino-4-hydroxyphenyl) hexafluoropropane, hexahydro-m-xylenediamine, 1,4-bis (aminomethyl)cyclohexane, 2,2-bis[4-(4-aminophenoxy) phenyl]hexafluoropropane, 2,2-bis(3-amino-4-methylphenyehexafluoropropane, 2,2-bis(3-aminophenyl) hexafluoropropane, 2,2-bis(4-aminophenyl) hexafluoropropane, 2,7-diaminofluorene, m-xylenediamine or 4,4'-methylenebis(2-ethyl-6-methylaniline); and the vinyl monomer is selected from the group consisting of vinyl chloride, styrene, methyl methacrylate, maleimide, butadiene, methyl acrylate, epoxy acrylate or bisphenol A-type epoxy methyl acrylate.

Another embodiment of the present invention provides a method of preparing the aforesaid curable resin comprising:
reacting the dianhydride with the diamine in the presence of a solvent to give a polyimide-based resin; and
allowing the resultant polyimide-based resin and the vinyl monomer to undergo a Michael addition reaction in the presence of a solvent to produce the desired curable resin.

In an aspect, the reaction of the polyimide-based resin with the vinyl monomer is carried out under a protective atmosphere at a temperature of from 50° C. to 300° C. for 0.5 hours to 5 hours.

Still another embodiment of the present invention provides a blue photoresist comprising: 2 to 30 parts by weight of the curable resin of embodiments of the present invention or prepared in accordance with the method of embodiments of the present invention; 2 to 20 parts by weight of a colorant; 30 to 90 parts by weight of a solvent; 0.01 to 1 part by weight of an initiator; and 0.005 to 0.02 parts by weight of an additive.

In an aspect, the solvent has a boiling point of 30° C. to 90° C. at one atmosphere. For instance, the solvent can be one or more selected from the group consisting of ether, pentane, dichloromethane, carbon disulfide, acetone, 1,1-dichloroethane, chloroform, methanol, tetrahydrofuran, n-hexane, trifluoroacetic acid, 1,1,1-trichloroethane, carbon tetrachloride, ethyl acetate, ethanol, butanone, cyclohexane, isopropanol, 1,2-dichloroethane, ethylene glycol dimethyl ether, trichloroethylene, and triethylamine.

In another aspect, the initiator is one or more selected from the group consisting of α-aminoketone-based photoinitiator, acylphosphine oxide photoinitiator, α-hydroxyketone-based photoinitiator, phenyl glyoxylate-based photoinitiator, and O-acyl-oxime ester-based photoinitiator.

Still another embodiment of the present invention provides a method of preparing the aforesaid blue photoresist comprising:
mixing the curable resin, the colorant, the solvent, the initiator, and the additive homogeneously;
degassing the homogeneously mixed materials to give a mixture; and
filtering the resultant mixture to give the blue photoresist.

Still another embodiment of the present invention provides a color filter comprising:
a substrate;
a Black Matrix arranged on the substrate; and
a blue filter layer arranged on the substrate, and located in regions separated by the Black Matrix,
wherein the blue filter layer is formed from the blue photoresist of embodiments of the present invention or the blue photoresist prepared in accordance with embodiments of the present invention.

Still another embodiment of the present invention provides a method of preparing the aforesaid filter comprising:
applying a black photoresist onto the substrate to form the Black Matrix;
forming sequentially red, green, and blue color filter layers in regions separated by the Black Matrix; and
preparing a transparent conductive layer on the color filter layer to produce the color filter.

In an aspect, the forming the blue filter layer comprises a pre-caking operation, and a curing operation, wherein the pre-caking operation is carried out at a temperature of from 20° C. to 50° C. for 30 seconds to 120 seconds; and the curing operation is carried out at a temperature of from 20° C. to 100° C. for 5 minutes to 30 minutes.

Still another embodiment of the present invention provides a color display device comprising the color filter of embodiments of the preset invention or the color filter prepared in accordance with the method of embodiments of the present application.

The curable resin of embodiments of the present invention addresses the technical problems that the resin prepared with conventional processes, and raw materials should be cured at a high temperature, so that the final curable resin produced in the reaction can be cured at a low temperature ranging from 20° C. to 100° C. Using such curable resin as the raw materials for a blue photoresist can not only save the energy consumption required by forming a blue filter layer from a blue photoresist by curing, but also allow other raw materials used in the production to have less heat resistance than those used in conventional processes so as to further reduce the cost.

BRIEF DESCRIPTION OF DRAWINGS

For further describing the technical solutions of embodiments of the present invention or the prior art, hereinafter the drawings required for illustrating the embodiments of the present invention or the prior art. It is apparent that the drawings as set forth below involve only some examples of the present invention. Persons skilled in the art can obtain other drawings based on these drawings without paying any creative work.

DETAILED DESCRIPTION OF INVENTION

Figure 1:
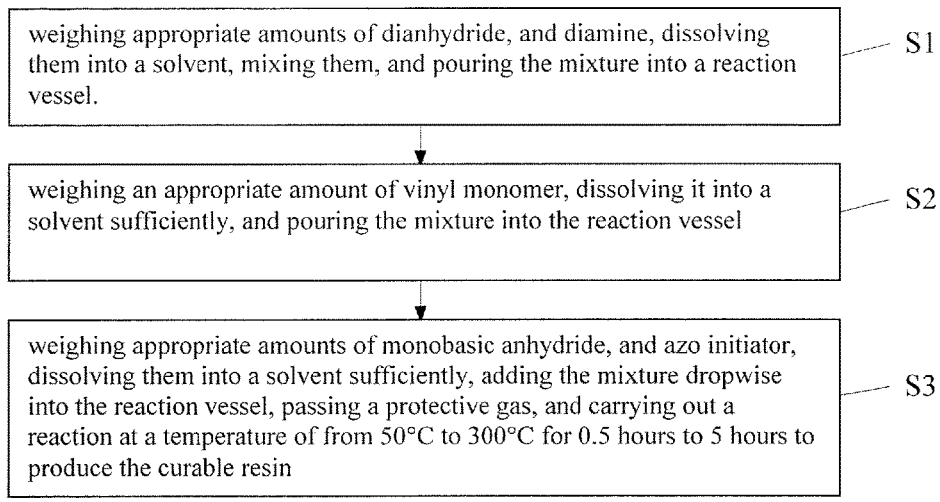
FIG. 1 shows a method of preparing the curable resin provided in the embodiments of the present invention.

Hereinafter the technical solutions of embodiments of the present invention will be clearly, and completely described with reference to the drawings of embodiments of the present invention. It is apparent that the described embodiments are only a portion, other than all of embodiments of the present invention. On the basis of the embodiments of the present invention, all the other embodiments made by persons of ordinary skill in the art without any creative work are encompassed within the present invention.

Hereinafter the curable resin, the blue photoresist, the color filter, and the methods of preparing the same, and the color display device of embodiments of the present invention are illustrated in details with reference to drawings.

An embodiment of the present invention provides a curable resin comprising: 1 part by weight of dianhydride; 0.8 to 1.5 parts by weight of diamine; and 1.5 to 5 parts by weight of vinyl monomer, wherein the dianhydride is selected from the group consisting of pyromellitic dianhydride, trimellitic anhydride, benzophenone tetracarboxylic dianhydride, biphenyltetracarboxylic dianhydride, 4,4'-oxydiphthalic anhydride or 4,4'-(hexafluoroisopropylidene) diphthalic anhydride; the diamine is selected from the group consisting of 3-aminobenzyl amine, 2,2'-difluoro-4,4'-(9-fluorenylidene)diphenylamine, 2,2-bis(3-amino-4-hydroxyphenyl)hexafluoropropane, hexahydro-m-xylenediamine, 1,4-bis(aminomethyl)cyclohexane, 2,2-bis[4-(4-aminophenoxy)phenyl]hexafluoropropane, 2,2-bis(3-amino-4-methylphenyl)hexafluoropropane, 2,2-bis(3-aminophenyl) hexafluoropropane, 2,2-bis(4-aminophenyl) hexafluoropropane, 2,7-diaminofluorene, m-xylenediamine or 4,4'-methylenebis(2-ethyl-6-methylaniline); and the vinyl monomer is selected from the group consisting of vinyl chloride, styrene, methyl methacrylate, maleimide, butadiene, methyl acrylate, epoxy acrylate or bisphenol A-type epoxy methyl acrylate.

During the preparation of the curable resin, the dianhydride, and the diamine are first subject to condensation reaction to produce a polyimide-based resin, followed by undergo a Michael addition reaction with the vinyl monomer, thereby producing a final product, i.e., the desired curable resin. The polyimide-based resin is represented by the structural formula as below:

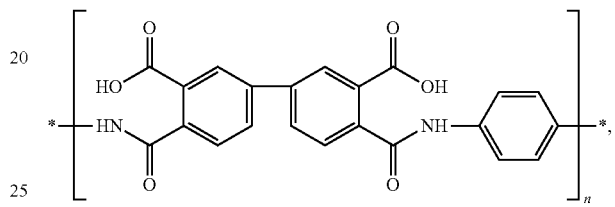

wherein n is from 75 to 450, e.g., from 75 to 375 or from 75 to 300. For instance, n=100, 120, 150, 180, 230, 245, or 270.

The curable resin of embodiments of the present invention is produced by the condensation reaction of dianhydride, diamine, and vinyl monomer, and the curing temperature thereof ranges from 20° C. to 100° C. In comparison with conventional curable resins, the curable resin addresses the technical problem that the resins prepared by using conventional processes, and raw materials have to be cured at a high temperature, and can be cured at a relatively low temperature. Using such curable resin as raw materials for a blue photoresist can not only save the energy consumption required by forming a blue filter layer from a blue photoresist by curing, but also allow other raw materials used in the production to have less heat resistance than those used in conventional processes so as to further reduce the cost.

As shown in FIG. 1, the curable resin can be prepared by:

Step S1: weighing appropriate amounts of dianhydride, and diamine, dissolving them into a solvent, mixing them, and pouring the mixture into a reaction vessel;

Step S2: weighing an appropriate amount of vinyl monomer, dissolving it into a solvent sufficiently, and pouring the mixture into the reaction vessel; and Step S3: weighing appropriate amounts of monobasic anhydride, and azo initiator, dissolving them into a solvent sufficiently, adding the mixture dropwise into the reaction vessel, passing a protective gas, and carrying out a reaction at a temperature of from 50° C. to 300° C. for 0.5 hours to 5 hours to produce the curable resin, wherein, in Step S1, the dianhydride, and the diamine as used can be 1 part by weight, and 0.8 to 1.5 parts by weight, respectively; in Step S2, the vinyl monomer, and the dianhydride as used can be 1.5 to 5 parts by weight, and 1 part by weight, respectively; and in Step S3, the monobasic anhydride, the azo initiator, and the dianhydride can be 0.25 to 0.85 parts by weight, 0.03 to 0.09 parts by weight, and 1 part by weight, respectively, wherein the monobasic anhydride can be selected from the group consisting of phthalic anhydride, nitrophthalic anhydride, halophthalic anhydride, hydroxyphthalic anhydride or aralkynylphthalic anhydride.

In all of the aforesaid Steps S1, S2, and S3, the amount of solvent as used is slightly excess, as long as it can ensure that the reaction can be sufficiently carried out or the raw materials can be sufficiently dissolved. For instance, in Step S1, the weight ratio of the solvent to the dianhydride can be from 10 to 30:1; in Step S2, the weight ratio of the solvent to the vinyl monomer can be from 2 to 5:1; and in Step S3, the weight ratio of the solvent, the monobasic anhydride, and the azo initiator can be from 2.5 to 6:0.3 to 0.8:0.03 to 0.09.

Moreover, in Step S3, the azo initiator is used to initiate the reaction between the polyimide-based resin produced by the reaction of the dianhydride, and the diamine, and the vinyl monomer, and the monobasic anhydride is used to regulate the molecular weight of the finally resultant curable resin. Thus, the two materials are used in relatively small amounts, and added dropwise in the reaction, thereby controlling the target molecular weight of the final curable resin. The protective gas can be nitrogen gas so as to protect the reaction from being interfered by oxygen gas in the reaction vessel.

The method of preparing the curable resin of embodiments of the present invention has the following advantages: the raw materials for preparing the polyimide-based resin in the method, i.e., the dianhydride, and the diamine, have wide resources, and can be synthesized in a simple process. The curable resin obtained from the addition reaction of these raw materials, and the vinyl monomer addresses the technical problem that the resin obtained in accordance with conventional processes has to be cured at a high temperature, and achieves the low-temperature curing of the curable resin. The curable resin produced in accordance with this method can reduce the energy consumption required during the production of a color filter.

Still another embodiment of the present invention further provides a blue photoresist comprising:

the curable resin of embodiments of the present invention or the curable resin prepared in accordance with embodiments of the present invention: 2 to 30 parts by weight;
colorant: 2 to 20 parts by weight;
solvent: 30 to 90 parts by weight;
initiator: 0.01 to 1 part by weight; and
additive: 0.005 to 0.02 parts by weight.

In an aspect, the solvent is a low-boiling solvent. For instance, the solvent has a boiling point of from 30° C. to 90° C. at an atm. For instance, the solvent can be one or more selected from the group consisting of ether, pentane, dichloromethane, carbon disulfide, acetone, 1,1-dichloroethane, chloroform, methanol, tetrahydrofuran, n-hexane, trifluoroacetic acid, 1,1,1-trichloroethane, carbon tetrachloride, ethyl acetate, ethanol, butanone, cyclohexane, isopropanol, 1,2-dichloroethane, ethylene glycol dimethyl ether, trichloroethylene, and triethylamine.

In another aspect, the colorant can be one or more selected from the group consisting of blue pigments, violet pigment, and blue dyes. For instance, the blue pigment can be selected from the group consisting of: P.B.1, P.B.2, P.B.15, P.B.15: 3, P.B.15: 4, P.B.15: 6, P.B.16, P.B.22, P.B.60 or P.B.66; the violet pigment can be selected from the group consisting of: P.V.32, P.V.36, P.V.38, P.V.39, P.V. 23, P.V.9 or P.V.1; and the blue dye can be selected from the group consisting of: C.I. Direct Blue 288, C.I. Direct Blue 93, C.I. Direct Blue 116, C.I. Direct Blue 148, C.I. Direct Blue 149, C.I. Direct Blue 150. C.I. Direct Blue 159, C.I. Direct Blue 162 or C.I. Direct 163.

In another aspect, the initiator can be one or more selected from the group consisting of α-aminoketone-based photoinitiator: Irgacure 907, Igracure369, Irgacure1300; or acylphosphine oxide photoinitiator: Irgacure819, Irgacure819DW, Irgacure2010, Darocur TPO, Darocur4265; or α-hydroxyketone-based photoinitiator: Darocur1173, Irgacure184, Irgacure2959, Irgacure500, Irgacure1000; or phenylglyoxylate-based photoinitiator: ITX, MBF, Darocur MBF, Irgacure754; or O-acyl-oxime ester-based photoinitiator: OXE-01, OXE-02 or Quanta cure PDO.

In another aspect, the additive can be one or more selected from the group consisting of adhesion promoter, leveling agent, and wetting agent.

For instance, one or more selected from the group consisting of γ-(2,3-epoxypropoxy)propyltrimethoxysilane, β-(3,4-epoxycyclohexane)ethyltrimethoxysilane, γ-aminopropyltriethoxysilane, long chain alkyl trimethoxysilane, vinyltriethoxysilane, vinyltrimethoxysilane, γ-chloropropyltriethoxysilane, bis-(γ-triethoxysilylpropyl)tetrasulfide, anilinemethyltriethoxysilane, N-β-(aminoethyl)-γ-aminopropyltrimethoxysilane, N-(β-aminoethyl)-γ-aminopropyltriethoxysilane, N-β-(aminoethyl)-γ-aminopropylmethyldimethoxysilane, γ-(2,3-epoxypropoxy)propyltrimethoxysilane, γ-(methylacryloyloxy)propyltrimethylsilane, γ-mercaptopropyltrimethoxysilane or γ-mercaptopropyltriethoxysilane can be used as the adhesion promoter to increase the adhesion to a glass surface.

Alternatively, for example, one or more selected from the group consisting of organosilicone wetting agent, fluorocarbon-modified polyacrylate leveling agent, and acrylic leveling agent can be added as leveling agent and/or wetting agent if required to improve the surface properties of film formed from the pigment photoresist.

The blue photoresist of embodiments of the present invention comprises a curable resin having a low curing temperature, which co-operates with given amounts of other components in the formula so that the curing temperature during the formation of a blue filter layer from the blue photoresist decrease from 20° C. to 100° C., thereby reducing effectively the energy consumption required in the production of a color filter and saving the cost. The blue photoresist formulation of embodiments of the present invention, as compared with to the existing blue photoresists, comprises not only the curable resin having a low curing temperature, but also a low-boiling solvent. Such low-boiling solvent can help the curable resin to meet the requirement of low-temperature curing, so that the blue photoresist can be cured at a low temperature during the production of a color filter, thereby saving the energy consumption required by the production of the color filter.

Figure 2:
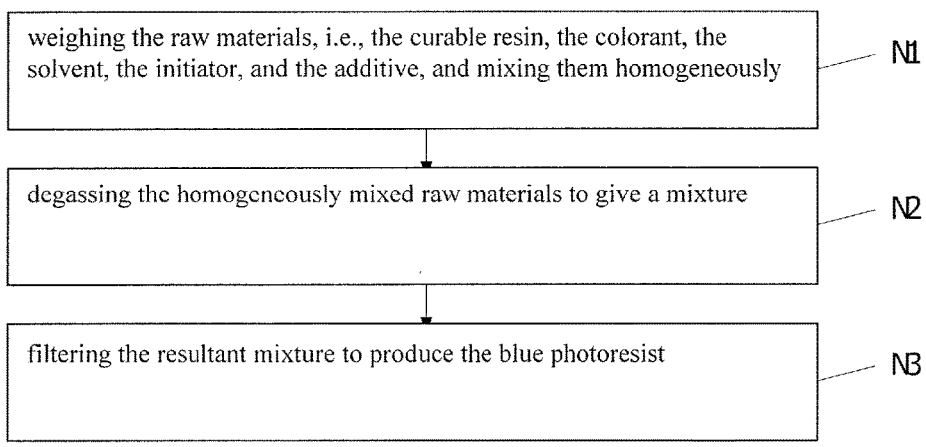
FIG. 2 shows a method of preparing the blue photoresist provided in the embodiments of the present invention.

As shown in FIG. 2. e.g., the blue photoresist can be prepared by:

Step N1: weighing the raw materials, i.e., the curable resin, the colorant, the solvent, the initiator, and the additive, and mixing them homogeneously;

Step N2: degassing the homogeneously mixed raw materials to give a mixture; and

Step N3: filtering the resultant mixture to produce the blue photoresist.

Of those, in Step N1, the weight ratio of the curable resin, the solvent, the initiator, and the additive can be 2-30:2-20:30-90:0.01-1:0.005-0.02, preferably 5-30:5-20:40-90:0.01-1:0.005-0.015, more preferably 5-25:5-18:45-90:0.01-1:0.005-0.01. It is to be understood that the components and amounts of embodiments of the present invention are preferable formulations of the blue photoresist, but not limited thereto. Persons skilled in the art can determine or adjust the weight parts of the aforesaid raw materials on the basis of the disclosure of the present invention, as well as common knowledge or conventional technical means in the art.

In Step N2, the raw materials as mixed homogeneously in Step N1 can be degassed in a degassing box to remove the gas bubbles from the raw materials so that the raw materials are mixed homogeneously and dispersed. For instance, the degassing can be carried out once or twice, each for 10 to 30 minutes. It is to be understood that embodiments of the present invention are not limited thereto Persons skilled in the art can determine or adjust the degassing times and periods on the basis of the disclosure of the present invention, as well as common knowledge or conventional technical means in the art.

In Step N3, the mixture is filtered to remove insoluble materials so that the mixture is smooth and fine on the whole.

The method of preparing the blue photoresist of embodiments of the present invention has the following advantages: the process steps are simple and easy for operation, and the method can decrease the curing temperature during the formation of a blue filter layer from the blue photoresist and achieve the low-temperature curing, thereby saving the energy consumption required by the production of color filter and reducing the cost.

Still another embodiment of the present invention further provides a color filter comprising a substrate, a Black Matrix arranged on the substrate, and a blue filter layer arranged on the substrate and located in regions separated by the Black Matrix, wherein the blue filter layer is formed by the blue photoresist of embodiments of the present invention or the blue photoresist prepared in accordance with the method of embodiments of the present invention.

The color filter of embodiments of the present invention has the following advantages: The blue photoresist for forming the blue filter layer of the color filter comprise a curable resin having a low curing temperature, which co-operates with given amounts of other components in the formula so that the curing temperature during the formation of a blue filter layer from the blue photoresist decrease from 20° C. to 100° C., thereby reducing effectively the energy consumption required in the production of a color filter and saving the cost.

Figure 3:
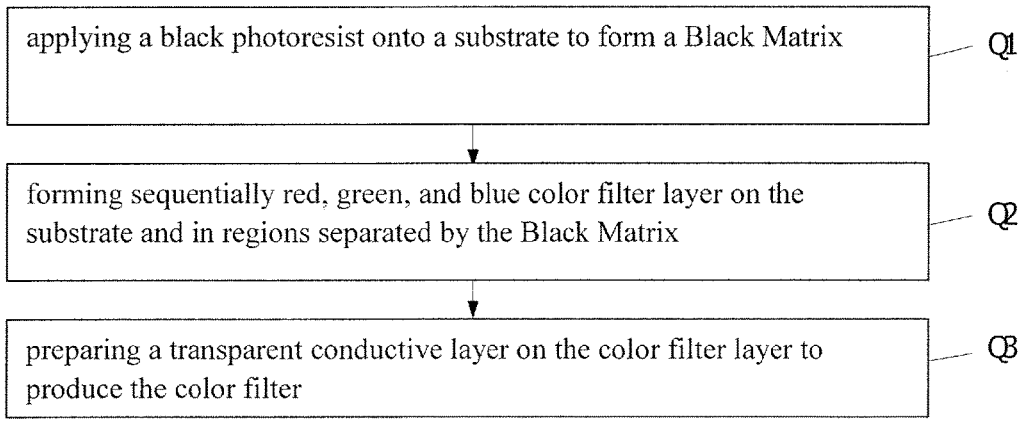
FIG. 3 shows a method of preparing the color filter provided in the embodiments of the present invention.

For instance, as shown in FIG. 3, the color filter can be prepared by:

Step Q1: applying a black photoresist onto a substrate to form a Black Matrix;

Step Q2: forming sequentially red, green, and blue color filter layer on the substrate and in regions separated by the Black Matrix; and Step Q3: preparing a transparent conductive layer on the color filter layer to produce the color filter.

In Step Q3, the forming the blue filter layer comprising a pre-caking operation and a curing operation. For instance, the pre-caking operation can be carried out at a temperature of from 20° C. to 50° C. for 30 seconds to 120 seconds. For instance, the curing operation can be carried out at a temperature of from 20° C. to 100° C. for 5 minutes to 30 minutes, preferably at a temperature of from 20° C. to 80° C. for 5 minutes to 20 minutes, and more preferably at a temperature of from 20° C. to 60° C. for 5 minutes to 15 minutes.

It is to be understood that embodiments of the present invention are not limited thereto, and persons skilled in the art can select the reaction conditions of each step in accordance with the disclosure of the present invention, as well as common knowledge or conventional technical means in the art.

The method of preparing the color filter of embodiments of the present invention has the following advantages: since a curable resin having a low curing temperature is added into the process of forming a color filter by using a blue filter layer, the method achieves the low-temperature curing of the blue filter layer, thereby reducing the energy consumption required b the production of the color filter and reducing the cost for producing color display devices. Moreover, since a low-boiling solvent is used in the method of preparing the color, the solvent volatilizes easily and completely at a relatively low temperature during curing so as to facilitate a fast curing of the blue photoresist to form a blue filter layer, thereby further decreasing the curing temperature of the blue photoresist, and consequently reducing the energy consumption and cost required by the production of the color filter.

Still another embodiment of the present invention further provides a color display device comprising the color filter of embodiments of the present invention or the color filter prepared in accordance with the method of embodiments of the present invention.

The blue photoresist for forming a blue filter layer of a color filter comprises a curable resin having a low curing temperature, which co-operates with given amounts of other components of the blue photoresist formula so as to decrease the curing temperature in the process of forming a blue filter layer by curing a blue photoresist, thereby reducing effectively the energy consumption required by the production of the color filter, and consequently reducing the energy consumption required by the production of the color display device and saving the cost.

For further illustrating the present invention, hereinafter it is described in details with reference to the examples.

Example 1

Preparation of Curable Resin

First, 1 part by weight of pyromellitic dianhydride and 0.9 parts by weight of 2,2-bis[4-(4-aminophenoxy)phenyl] hexafluoropropane were weighed and dissolved in 12 parts by weight of ethylene glycol dimethyl ether, mixed sufficiently homogeneously, and poured into a four-neck flash equipped with a heating device, a reflux device, a stirring device, and a dropping device. Then, 2 parts by weight of was weighed and dissolved sufficiently in 4.5 parts by weight of cyclohexane, and poured into the reaction vessel. Finally, 0.3 parts by weight of 4-hydroxyphthalic anhydride and 0.04 parts by weight of 2,2'-Azobis-(2-methylbutyronitrile) (AMBN) were weighed and dissolved sufficiently in 2.7 parts by weight of ethylene glycol dimethyl ether, and added dropwise into the four-neck flask. Nitrogen was passed into the reaction vessel. The reaction ran at a temperature of 120° C. for 3 hours to produce the curable resin.

The curable resin was analyzed by gel permeation chromatograph to find: the molecular weight of the curable resin was 84071.62 (measured); 84071.12 (calculated).

Preparation of Blue Photoresist

First, the raw materials including 7 parts by weight of the above-prepared curable resin, 8 parts by weight of blue pigment P.B.1, 50 parts by weight of acetone, 0.03 parts by weight of Irgacure2010, and 0.006 parts by weight of γ-aminopropyltriethoxysilane additive were weighed, stirred and mixed homogeneously. Then, the homogeneously mixed raw materials were degassed twice, each 15 minutes, to produce a mixture. The resultant mixture was filtered to remove impurities to a blue photoresist.

Preparation of Color Filter

First, a black photoresist was applied onto a substrate to form a Black Matrix. Then, red, green, and blue photoresists were sequentially applied into regions separated by the Black Matrix on the substrate, and pre-baked at a temperature of 40° C. for 70 seconds, Then, the photoresists were cured at a temperature of 90° C. to form red, green, and blue color filter layers with a thickness of 2.1 µm. A conductive layer was prepared on the color filter layer to give the color filter.

Example 2

Preparation of Curable Resin

First, 1 part by weight of trimellitic anhydride and 1.2 parts by weight of 2,2-bis[4-(4-aminophenoxy)phenyl] hexafluoropropane were weighed and dissolved in 15 parts by weight of 1,1,1-trichloroethane, mixed sufficiently homogeneously, and poured into a four-neck flask equipped with a heating device, a reflux device, a stirring device, and a dropping device. Then, 2.4 parts by weight of methyl acrylate was weighed and dissolved sufficiently in 6.5 parts by weight of cyclohexane, and also poured into the reaction vessel. Finally, 0.5 parts by weight of nitrophthalic anhydride and 0.05 parts by weight of AMBN were weighed and dissolved sufficiently in 2.5 parts by weight of 1,1,1-trichloroethane, added dropwise into the four-neck flask. Nitrogen was passed into the reaction vessel. The reaction ran at a temperature of 160° C. for 2.5 hours to produce the curable resin.

The curable resin was analyzed by gel permeation chromatograph to find: the molecular weight of the curable resin was 81070.92 (measured); 81070.26 (calculated).

Preparation of Blue Photoresist

First, the raw materials including 10 parts by weight of the above-prepared curable resin, 12 parts by weight of violet pigment P.V.36, 65 parts by weight of chloroform, 0.05 parts by weight of Irgacure 907, 0.005 parts by weight of γ-(2,3-epoxypropoxy) propyltrimethoxysilane, and JUST-3788 (a fluorocarbon-modified polyacrylate) were weighed, stirred and mixed homogeneously. Then, the homogeneously mixed raw materials were degassed twice, each 15 minutes, to produce a mixture. The resultant mixture was filtered to remove impurities to give blue photoresist.

Preparation of Color Filter

First, a black photoresist was applied onto a substrate to form a Black Matrix. Then, red, green, and blue photoresists were applied into regions separated by the Black Matrix on the substrate. The photoresists were pre-baked at a temperature of 40° C. for 80 seconds, and cured at a temperature of 80° C. to form sequentially red, green, and blue color filter layers with a thickness of 2.1 µm. A conductive layer was prepared on the color filter layer to give the color filter.

Example 3

Preparation of Curable Resin

First, 1 parts by weight of benzophenone tetracarboxylic dianhydride and 1.4 parts by weight of 2,2-bis[4-(4-aminophenoxy)phenyl]hexafluoropropane were weighed and dissolved in 18 parts by weight of dichloromethane, mixed sufficiently homogeneously and poured into a four-neck flask equipped with a heating device, a reflux device, a stirring device, and a dropping device. Then, 3 parts by weight of maleimide was weighed and dissolved sufficiently in 10 parts by weight of cyclohexane, and also poured into the reaction vessel. Finally, 0.65 parts by weight of 4-hydroxyphthalic anhydride and 0.06 parts by weight of AMBN were sufficiently dissolved in 3.2 parts by weight of dichloromethane, and added dropwise into the four-neck flask. Nitrogen was passed into the reaction vessel. The reaction ran at a temperature of 180° C. for 1.5 hours to produce the curable resin.

The curable resin was analyzed by gel permeation chromatograph to find: the molecular weight of the curable resin was 93775.74 (measured); 93775.12 (calculated).

Preparation of Blue Photoresist

First, the raw materials including 15 parts by weight of the above prepared curable resin, 14 parts by weight of blue dye C.I. Direct Blue 288, 75 parts by weight of ethanol, 0.08 parts by weight of Darocurl 173, 0.006 parts by weight of β-(3,4-epoxycyclohexane)ethyltrimethoxysilane, and 0.003 parts by weight of organosilicone were weighed, stirred and mixed homogeneously. Then, the homogeneously mixed raw materials were degassed twice, each 15 minutes, to produce a mixture. The resultant mixture was filtered to remove impurities to give blue photoresist.

Preparation of Color Filter

First, a black photoresist was applied onto a substrate to form a Black Matrix. Then, red, green, and blue photoresists were applied into regions separated by the Black Matrix on the substrate. The photoresists were pre-baked at a temperature of 40° C. for 100 seconds, and then cured at a temperature of 52° C. to form sequentially red, green, and blue color filter layers with a thickness of 2.1 µm. A conductive layer was prepared on the color filter layer to give the color filter.

Test of Performance

1) Test Chemical Resistance

The color filters prepared in Examples 1 to 3 were subject to chemical resistance test, respectively, by the following procedures:

The color filter was cut to give two test pieces having a dimension of 10×10 cm$^2$, which was denoted as A and B, respectively.

The test pieces A and B were immersed in a 5% NaOH solution and a 5% isopropanol solution at room temperature for 20 minutes. Then, the test pieces were removed, washed, and completely dried at a temperature of 50° C. The treated test pieces A and B were measured with a spectrophotometer for their color coordinates, respectively. The measured color coordinates were compared with standard color coordinates for calculation of ΔE value. The resultant data were shown in Table 1.

TABLE 1

Chemical Resistance ΔE of the Color Filters of Examples 1 to 3

| | Ex. 1 | | Ex. 2 | | Ex. 3 | |
| --- | --- | --- | --- | --- | --- | --- |
| | A | B | A | B | A | B |
| color coordinates (x, y) | 0.140, 0.091 | 0.140, 0.093 | 0.141, 0.079 | 0.141, 0.080 | 0.141, 0.075 | 0.141, 0.076 |
| ΔE value | 2.3 | 2.3 | 2.3 | 2.2 | 2.1 | 2.2 |

Chemical Resistance refers to the ability of color filter to resist corrosion under acidic, basic or solvent conditions, which is one of the reliability requirements of color filters during the later stage of the production. The evaluation standards of good chemical resistance of the blue filter layer depends on the chromatism value ΔE, namely, the ratio of the color coordinates of the treated blue filter layer to the standard color coordinates. In generally, it is believed that when the ΔE value<3, the chemical resistance of the blue filter layer meets the standard requirement. From the test results of the blue filter layers of the aforesaid examples, it can be seen that all the blue filter layers of these examples meet the standards of chemical resistance, that is to say, all of them have relatively good chemical resistance. Thus, the resultant color filters also have relatively good chemical resistance.

2) Test of Heat Resistance

The color filters prepared in Examples 1 to 3 were subject to heat resistance test, respectively, by the following procedures:

The color filter was cut to give two test pieces having a dimension of 10×10 cm$^2$, which is denoted as "C" and "D", respectively.

The test pieces C and D stood at a temperature of 100° C. for 30 minutes, and then removed. The treated test pieces C and D were measured with a spectrophotometer for their color coordinates, respectively. The measured color coordinates were compared with standard color coordinates for calculation of ΔE value. The resultant data were shown in Table 2.

TABLE 2

Heat Resistance, ΔE, of the color filters of Examples 1 to 3

| | Ex. 1 | | Ex. 2 | | Ex. 3 | |
|---|---|---|---|---|---|---|
| | C | D | C | D | C | D |
| color coordinates (x, y) | 0.140, 0.091 | 0.140, 0.092 | 0.141, 0.079 | 0.141, 0.080 | 0.141, 0.074 | 0.141, 0.075 |
| ΔE value | 2.1 | 2.4 | 2.5 | 2.5 | 2.6 | 2.5 |

Heat resistance refers to the ability of a color filter to resist high temperature, which is also one of the reliability requirements of color filters during the later stage of the production. The evaluation standards of good heat resistance of the blue filter layer depends on the chromatism value ΔE, namely, the ratio of the color coordinates of the treated blue filter layer to the standard color coordinates. In generally, it is believed that when the ΔE value<3, the heat resistance of the blue filter layer meets the standard requirement. From the test results of the blue filter layers of the aforesaid examples, it can be seen that all the blue filter layers of these examples meet the standards of heat resistance, that is to say, all of them have relatively good heat resistance. Thus, the resultant color filters also have relatively good heat resistance.

Based on the above reasons, the color filter of embodiments of the present invention the color filter exhibits relatively good effects in terms of both chemical resistance and heat resistance, and indicate stable properties. The incorporation of a curable resin having a low curing temperature into the blue photoresist for preparing a color filter enables the color filter to save the energy consumption required in the product while keeping a stable property. It is not only environment friendly, but also reduces substantially the cost for producing color display devices.

It is apparent that the aforesaid examples are not provided for limiting the embodiments of the present invention, but only for the illustrative purpose. Persons of ordinary skill in the art can made other different modification or variation based on the aforesaid description. It is neither able nor necessary to list exhaustively all the embodiments, while the apparent modifications and variations extended therefrom are also encompassed within the scope of the present invention.

The invention claimed is:

1. A curable resin comprising:
   dianhydride: 1 part by weight;
   diamine: 0.8 to 1.5 parts by weight; and
   vinyl monomer: 1.5 to 5 parts by weight,
   wherein
   the dianhydride is selected from the group consisting of
      pyromellitic dianhydride,
      benzophenone tetracarboxylic dianhydride,
      biphenyltetracarboxylic dianhydride,
      4,4'-oxydiphthalic anhydride or
      4,4'-(hexafluoroisopropylidene)diphthalic anhydride;
   the diamine is selected from the group consisting of
      3-aminobenzyl amine,
      2,2'-difluoro-4,4'-(9-fluorenylidene)diphenylamine,
      hexahydro-m-xylenediamine,
      1,4-bis(aminomethyl)cyclohexane,
      2,2-bis[4-(4-aminophenoxy)phenyl]hexafluoropropane,
      2,7-diaminofluorene,
      m-xylenediamine or
      4,4'-methylenebis(2-ethyl-6-methylaniline); and
   the vinyl monomer is selected from the group consisting of vinyl chloride, styrene, methyl methacrylate, maleimide, butadiene, methyl acrylate, epoxy acrylate or bisphenol A-type epoxy methyl acrylate,
   wherein the curing temperature of the curable resin ranges from 20° C. to 100° C.

2. A blue photoresist comprising:
   the curable resin of claim 1, a colorant, a solvent, an initiator, and an additive;
      wherein, the weights of the curable resin, the colorant, the solvent, the initiator and the additive are:
      the curable resin: 2 to 30 parts by weight;
      the colorant: 2 to 20 parts by weight;
      the solvent: 30 to 90 parts by weight;
      the initiator: 0.01 to 1 part by weight; and
      the additive: 0.005 to 0.02 parts by weight,
   wherein the colorant is one or more selected from the group consisting of blue pigment, violet pigment, and blue dye.

3. The blue photoresist of claim 2, wherein the solvent has a boiling point of from 30° C. to 90° C. at an atm, and the solvent is one or more selected from the group consisting of ether, pentane, dichloromethane, carbon disulfide, acetone, 1,1-dichloroethane, chloroform, methanol, tetrahydrofuran, n-hexane, trifluoroacetic acid, 1,1,1-trichloroethane, carbon tetrachloride, ethyl acetate, ethanol, butanone, cyclohexane, isopropanol, 1,2-dichloroethane, ethylene glycol dimethyl ether, trichloroethylene, and triethylamine.

4. The blue photoresist of claim 3, wherein the initiator is one or more selected from the group consisting of α-aminoketone-based photoinitiator, acylphosphine oxide photoinitiator, α-hydroxyketone-based photoinitiator, phenylglyoxylate-based photoinitiator, and O-acyl-oxime ester-based photoinitiator.

5. A color filter comprising:
   a substrate;
   a Black Matrix arranged on the substrate; and
   a blue filter layer arranged on the substrate and located in regions separated by the Black Matrix,
   wherein the blue filter layer is formed from the blue photoresist of claim 3.

6. The blue photoresist of claim 2, wherein the initiator is one or more selected from the group consisting of α-aminoketone-based photoinitiator, acylphosphine oxide photoinitiator, α-hydroxyketone-based photoinitiator, phenylglyoxylate-based photoinitiator, and O-acyl-oxime ester-based photoinitiator.

7. A color filter comprising:
- a substrate;
- a Black Matrix arranged on the substrate; and
- a blue filter layer arranged on the substrate and located in regions separated by the Black Matrix,
- wherein the blue filter layer is formed from the blue photoresist of claim 6.

8. A color filter comprising:
- a substrate;
- a Black Matrix arranged on the substrate; and
- a blue filter layer arranged on the substrate and located in regions separated by the Black Matrix, wherein the blue filter layer is formed from the blue photoresist of claim 2.

9. A color display device comprising the color filter of claim 8.

10. A method of preparing the color filter of claim 8, wherein it comprising:
- Step Q1: applying a black photoresist onto a substrate to form a Black Matrix;
- Step Q2: forming sequentially red, green, and blue color filter layers on the substrate and in regions separated by the Black Matrix; and
- Step Q3: preparing a transparent conductive layer on the color filter layer to produce the color filter.

11. The method of preparing the color filter of claim 10, wherein, the Step Q2 of forming the blue filter layer comprises a pre-caking operation and a curing operation, wherein the pre-caking operation is carried out at a temperature of from 20° C. to 50° C. for 30 seconds to 120 seconds; and the curing operation is carried out at a temperature of from 20° C. to 100° C. for 5 minutes to 30 minutes.

12. A method of preparing the blue photoresist of claim 2, wherein it comprising:
- Step N1: weighing the raw materials, i.e., the curable resin, the colorant, the solvent, the initiator, and the additive, and mixing them homogeneously;
- Step N2: degassing the homogeneously mixed raw materials to give a mixture; and
- Step N3: filtering the resultant mixture to produce the blue photoresist.

13. A method of preparing the curable resin of claim 1, wherein it comprising:
- Step S1: weighing dianhydride and diamine, dissolving them into a solvent, mixing them homogeneously, and pouring the mixture into a reaction vessel;
- Step S2: weighing vinyl monomer, dissolving it into a solvent sufficiently, and pouring the mixture into the reaction vessel; and
- Step S3: weighing monobasic anhydride, and azo initiator, dissolving them into a solvent sufficiently, adding the mixture dropwise into the reaction vessel, passing a protective gas, and carrying out a reaction at a temperature of from 50° C. to 300° C. for 0.5 hour to 5 hours to produce the curable resin.

* * * * *